United States Patent [19]
Anand et al.

[11] Patent Number: 5,883,422
[45] Date of Patent: *Mar. 16, 1999

[54] REDUCED PARASITIC CAPACITANCE SEMICONDUCTOR DEVICES

[75] Inventors: Yoginder Anand, Chelmsford; Percy Bomi Chinoy, Burlington, both of Mass.

[73] Assignee: The Whitaker Corporation, Wilmington, Del.

[ * ] Notice: This patent issued on a continued prosecution application filed under 37 CFR 1.53(d), and is subject to the twenty year patent term provisions of 35 U.S.C. 154(a)(2).

[21] Appl. No.: 698,744

[22] Filed: Aug. 16, 1996

Related U.S. Application Data

[60] Provisional application No. 60/020,834 Jun. 28, 1996.

[51] Int. Cl.⁶ .................................. H01L 27/095
[52] U.S. Cl. .................. 257/471; 257/486; 257/759
[58] Field of Search ............................ 257/471, 485, 257/486, 759, 767, 776, 770

[56] References Cited

U.S. PATENT DOCUMENTS

| | | | |
|---|---|---|---|
| 4,692,998 | 9/1987 | Armstrong et al. | 437/225 |
| 4,733,290 | 3/1988 | Reardon et al. | 357/69 |
| 4,859,616 | 8/1989 | Losehhand et al. | 437/39 |
| 5,145,809 | 9/1992 | Walker | 437/203 |
| 5,268,310 | 12/1993 | Goodrich et al. | 437/15 |
| 5,528,209 | 6/1996 | Macdonald et al. | 257/691 |
| 5,532,506 | 7/1996 | Tserng | 257/276 |
| 5,696,466 | 12/1997 | Li | 330/286 |

FOREIGN PATENT DOCUMENTS

| | | | |
|---|---|---|---|
| 0 709 882 A2 | 5/1996 | European Pat. Off. | H01L 23/29 |
| 05211279 | 8/1993 | Japan | H01L 25/00 |
| A-05343606 | 12/1993 | Japan | H01L 25/04 |
| 07221190 | 8/1995 | Japan | H01L 21/8222 |

OTHER PUBLICATIONS

Percy B. Chinoy, James Tajadod, "Processing and Microwave Characterization of Multilevel Interconnects Using Benzocyclobutene Dielectric", 16 (1993) Nov., No. 7, New York, US, pp. 714–719.

A.J.G. Strandjord, R.H. Heistand, J.N. Bremmer, P.E. Garrou, T.G. Tessier, "A Photosensitive–BCB on Laminate Technology (MCM–LD)", Jan. 5, 1994, pp. 374–386.

Percy B. Chinoy, "Processing and Electrical Characterization of Multilayer Metallization for Microwave Applications", pp. 713–719. International Conference on Multi–Chip Modules, Apr. 1995.

Abstract of Japan, vol. No. 18, No. 171,JP 05 343 606 Publication Date Dec. 24, 1993.

Abstract of Japan, vol. No. 096, No. 009, JP 08 124 919 Publication Date May 17, 1996.

International Search Report, Applicants ref. no. 16663 PCT, international applicaton No. PCT/US 97/11083, International filing date 25 Jun. 1997.

*Primary Examiner*—Peter Toby Brown
*Assistant Examiner*—Roy Potter
*Attorney, Agent, or Firm*—W. S. Francos

[57] ABSTRACT

A semiconductor device structure having a semiconductor device on a substrate with a layer of benzocyclobutane (BCB) disposed about the device with a via between the top surface of the BCB and the device is disclosed. A bond pad is in contact with the via and is connected to a bond ribbon.

8 Claims, 3 Drawing Sheets

REDUCED PARASITIC CAPACITANCE SEMICONDUCTOR DEVICES

This application claims the benefit of U.S. Provisional Application No. 60/020,834, Filed Jun. 28, 1996.

Field of the Invention

The present invention relates to a technique for reducing parasitic capacitances in high speed schottky barrier and p-n junction devices while improving manufacturing yield and performance.

BACKGROUND OF THE INVENTION

In many applications of rf and microwave frequency devices, improvement lies solely in the ability to modulate or detect very weak signals. In the microwave and rf frequency range, very sensitive receivers are essential to progress being made in radio frequency communications and radar systems. Junction diodes designed specifically for parametric interaction are varactor diodes. High frequency varactor and schottky diodes are generally gallium arsenide based, while in many applications varactor and schottky diodes are silicon based devices.

As the frequency response of the devices is increased, parasitic elements of capacitance and inductance must be minimized to a large extent in the design of the device. To this end, capacitive as well as parasitic inductance elements can have dramatic ill effects on the frequency response of a device.

Turning first to the capacitance of a given device, there are basically three areas where capacitance can arise. First, is the junction capacitance associated with the junction between distinct layers of the semiconductor device. Generally in order to reduce the junction capacitance of the given device, junction widths are reduced as greatly as possible. However, often the tradeoff between the reduction in junction capacitance and the increase in series resistance by reduction of junction width must be considered with great scrutiny. Furthermore, the capacitance associated with the packaging of the device must be considered and reduced as much as possible. Finally, bond pad capacitance, the focus of the present invention, occurs at the overlay structure of the junction, that is the bond pad with the metallization of the device.

Bond pad parasitic capacitance like other sources of capacitance is directly dependent upon the area of the bond pad. One possible solution for reducing bond pad capacitance has been to reduce the area of the bond pads themselves. In standard processing techniques, as is shown in FIG. 1, a standard varactor has a bond pad metalization on the order of one mil in width. This has the intrinsic benefit of reducing the capacitance associated with the bond pad and thereby improving the frequency response of the varactor. The package inductance plays an important role in the rf performance of the tuning varactor. In order to obtain maximum Q-factor (Quality Factor) especially at high frequencies, 3 mil bonding ribbon is preferred over bonding wire. Bonding a 3 mil ribbon to a 1 mil mesa GaAs junction is a difficult task and results in low production yield. Also, the reliability of the resultant device could be compromised. To this end, due to the relatively small area of the bond pad, the resultant manufacturing yields are generally very low. It could also result in a weak bond and a hence an unreliable contact to the device. This unreliability of the electrical contact can occur through the actual initial bonding to the device as well as a failure during the bond pull test which is performed during the reliability testing of the device.

In theory, the use of a one mil wirebond which is exactly aligned to the one mil bond pad produces a connection which is certainly reliable and strong enough to withstand a bond pull test. However, in practice this is generally not achieved. To this end, very often misalignment occurs and bond pull tests result in failure of the connection between the wirebond and the bond pad. Additionally, the use of wirebonds to effect the electrical connection to the bond pad also results in an increased inductance, a parasitic inductance to the device. This parasitic inductance degrades the performance of certain devices, for example, the turning ability of varactor diodes. Bond ribbons, an electrical material having a width on the order of three mils as opposed to the one mil wirebond, are used in applications where the inductance associated with wire bonds must be minimized. Bond ribbons give a lower inductance per unit length than the counterpart wirebond.

There are a couple of considerations that must be taken into account when determining the most effective method to effect electrical connection between the bond pad and the external circuit. First, when considering a bond ribbon, there is yet an even lower reliability and thus a reduced yield even when compared to the wire bond when using the standard 1 mil diameter bond pad. To this end, a 3 mil bond ribbon attached to a 1 mil diameter bond pad results in a high rate of peel-off during bond pull testing. This is a direct result of the overhang of the bond ribbon. This is shown more clearly in FIG. 1, a prior art varactor having the bond ribbon attached to the top bond pad. In order to properly effect a good bond ribbon/bond adhesion, it is necessary to increase the diameter of the bond pad making the bond strength between the bond ribbon and the bond pad optimal. Furthermore, in order to fabricate semiconductor diodes in high volume and at low cost, it is necessary to employ automatic bonding machines. But these bonding machines are based on pattern recognition principles and thus require a large bonding area on the order of at least 4 mils in diameter for effective operation. Accordingly, the diameter of the bond pad must be made larger than is done conventionally. This, as stated above will result in an increased capacitance associated with the bond pad which has the attendant disadvantages on high speed devices. Finally, it is of interest to note that in certain applications the wire bond is a preferred means to effect electrical connection from the bond pad to the external circuit, and accordingly a larger bond pad diameter would enable more reliable wire bond adhesion and thus would improve the reliability of the bond and thus the yield.

Accordingly, what is needed is a technique for effecting electrical connections at the device level for high speed devices which both reduces the overall bond pad capacitance as well as improves the bond strength. The resulting device has improved manufacturing yield as well as the improved performance required through reduced parasitic capacitance and inductance.

SUMMARY OF THE INVENTION

The present invention relates to a technique for bonding ribbon/wire to a bond pad on a semiconductor device which enables a strong bond between the bond ribbon and the bond pad by virtue of a relatively large bond pad, while reducing as greatly as possible the capacitance associated with the bond pad.

The semiconductor device of the present invention is processed with a standard width bond pad of about one mil. By having a relatively small bond pad width, the intrinsic capacitance of the bond pad, a parasitic capacitance, is kept to a minimal level. Thereafter, a layer of material, preferably benzocyclobutene (BCB) is deposited about the device and associated bond pad. A via is etched in the BCB by standard technique to enable access to the bond pad. Thereafter, a layer of metal is deposited along the side walls of the etched via and on top of the BCB. This layer of conductive material, preferably metal, has a relatively large area to enable a secure bond between the bond ribbon and the bond pad. This layer of metal has a diameter preferably larger than the diameter of the bond ribbon to assure a strong adhesion of the bond ribbon to the bond pad layer. However, by virtue of the BCB layer, there is no significant increase in the parasitic capacitance associated with the bond pad. To this end, the BCB material is chosen because of its relatively low dielectric constant when compared to other materials suitable in this application, for example, silicon dioxide. Furthermore, BCB can be deposited in a relatively thick layer, which also reduces the capacitance which is associated with the bond pad structure. The BCB process of the present invention is described in the present disclosure for a schottky diode as well as a tuning varactor. These two devices are being described for purposes of example, and are not intended to be limiting. To this end the present invention anticipates the use of the BCB process to reduce the bond pad capacitance for high speed devices such as a P-I-N diode, a tunnel diode, Gunn and Impatt devices, as well as other devices for particular application at microwave and millimeter wave frequencies.

As stated above, the bond strength of the wider bond pad of the present invention improves the overall yield as devices fabricated by the present technique survive in much greater number bond pull tests and other reliability tests. However, by virtue of the layer of BCB the overall capacitance of the device is unhindered by this relatively large bond pad. To this end, the increased capacitance in increasing the bond pad layer from one mil of the standard technique to four mils of the present invention could increase the intrinsic capacitance, a parasitic capacitance, by a factor of 16. However, by virtue of the low dielectric constant BCB which is deposited in relatively thick layers, larger bond pads are effected without significant degradation of capacitance when compared to conventional bond pad and bonding techniques. Furthermore, the device of the present invention enables automated bonding of the bond ribbon or bond wire to the bond pad.

Objects, Features, and Advantages

It is an object of the present invention to have a improved yield manufacturing process for Si/GaAs, InP and Si-Ge devices(two and three terminal devices) while reducing parasitic capacitances associated with bond pads.

It is a feature of the present invention to have a BCB polymer layer disposed about the semiconductor device structure having a increased bond pad area by metallization of a via in the BCB as well as a portion of the top surface of the BCB.

It is an advantage of the present invention to have a device having an improved bond pad-bond ribbon/bond wire adhesion strength without degradation of parasitic capacitance.

DETAILED DESCRIPTION OF THE INVENTION

Figure 3:
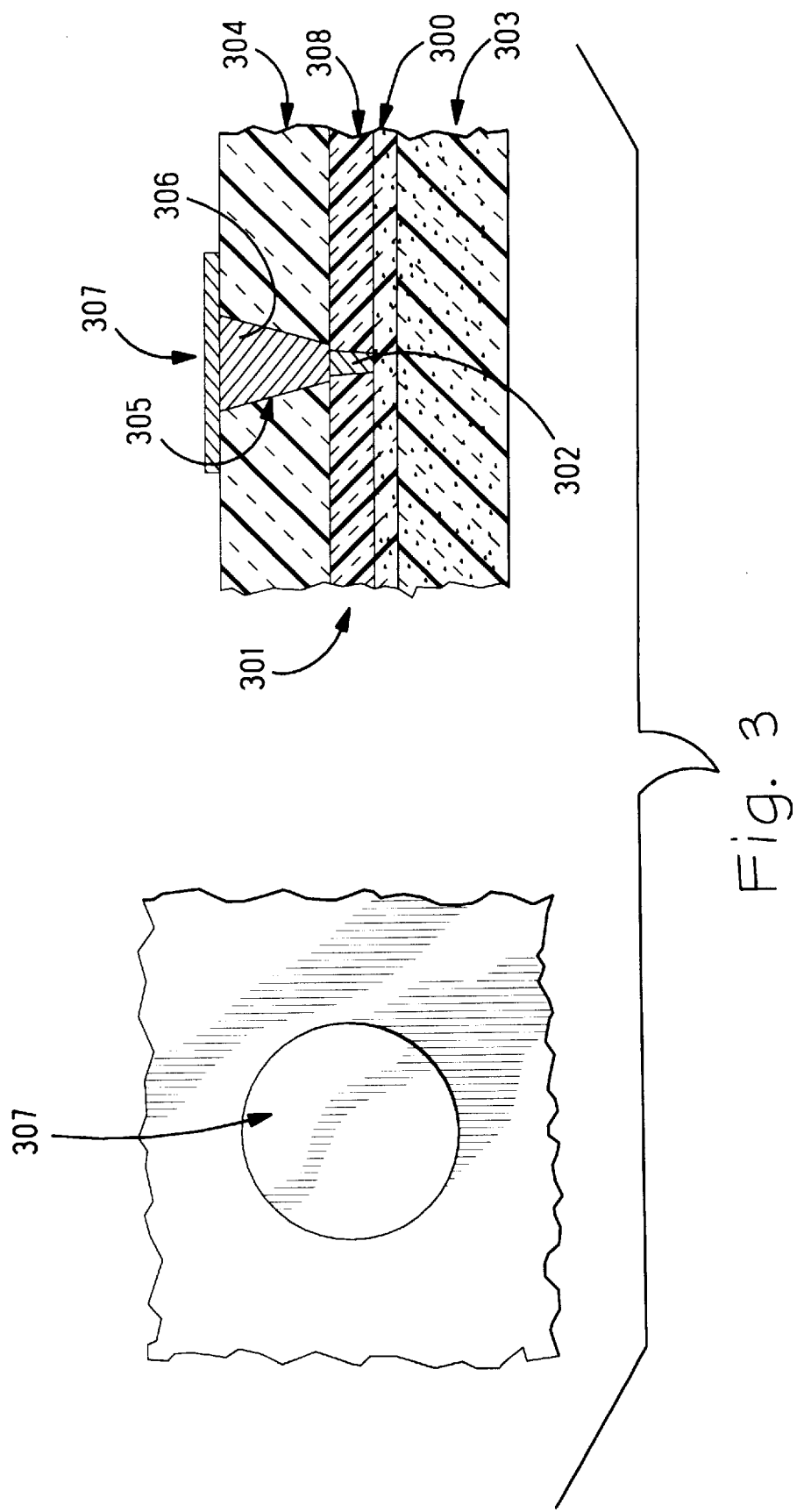
FIG. 3 shows the schottky barrier diode of the present invention having the bond pad attached to the bond wire in top view and cross sectional view.

Turning to FIG. 3, we see an exemplary side view of the device of the present invention. To this end, FIG. 3 shows the schottky device at 301. The schottky device is a standard device having a silicon layer doped n-type 300 and a metal barrier layer 302 layer disposed thereon to form a standard schottky layer.

In the fabrication of the schottky barrier diode, the n+ silicon substrate 303 has a doping layer greater than approximately $2 \times 10^{18}$ atoms per cm$^3$. The n-type epitaxial layer 300 is preferably silicon having a thickness on the order of 0.15 to 1.0 microns. The doping level in this epitaxial n-type layer for the semiconductor portion of the schottky barrier is preferably $5 \times 10^{16}$ atoms per cm$^3$–$1 \times 10^{17}$ atoms per cm$^3$ with the dopant of both the substrate and epitaxial type layer being a suitable donor dopant. The layer 308 of preferably silicon dioxide or silicon nitride is disposed on the epitaxial layer 300 as a mask for standard photolithographic etching techniques, as well as for passivation. This layer has a width on the order of 3,000–10,000 angstroms, and does not adversely effect the device by adding parasitic capacitance because of the relatively low dielectric constant of the materials. Having been etched, the layer 308 has disposed therein the layer of barrier metal 302, preferably titanium if a low barrier schottky barrier is desired; TiW if a medium barrier schottky diode is desired, and platinum for high barrier schottky diodes. This barrier material is deposited by standard deposition techniques. The layer of ECB 304 has been etched to have the via 305 and the bond pad metallization 306 therein as shown. This metallization is preferable to PtAgPtAu, with the titanium platinum acting as an adhesion layer serving as a diffusion barrier, the silver serving as a low cost conductive material for filling the via, gold for a reliable bonding surface.

The deposition of BCB as well as the etching to effect the via is as described in U.S. patent application Ser. No. 08/922.615 which is a continuation of 08/610,825, filed Mar. 7, 1996, abandoned to Chinoy et al the disclosure of which is specifically incorporated by reference. The via has sloped side walls as is shown, which are obtained by proximity exposure which enables good step coverage. Good adhesion of the bond pad to the BCB is obtained by an in-situ treatment of BCB with an ion gun prior to evaporation of the metal. The metal layer 306, 307 is disposed on the top surface of the BCB as well as in the via to make the connection to the layer 302 by standard evaporation techniques and other techniques as is described in the above captioned patent application. Thereafter, the bond wire is attached to the bond pad by standard technique.

Figure 4:
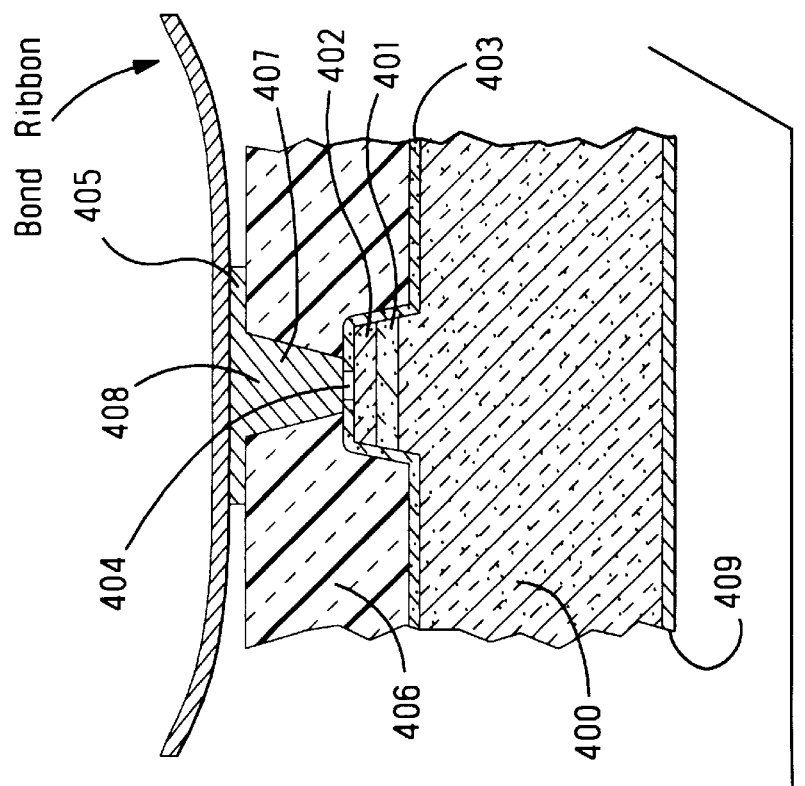
FIG. 4 shows the varactor of the present invention having the bond pad adhered to the bond ribbon in top view and cross sectional view.
Figure 4:
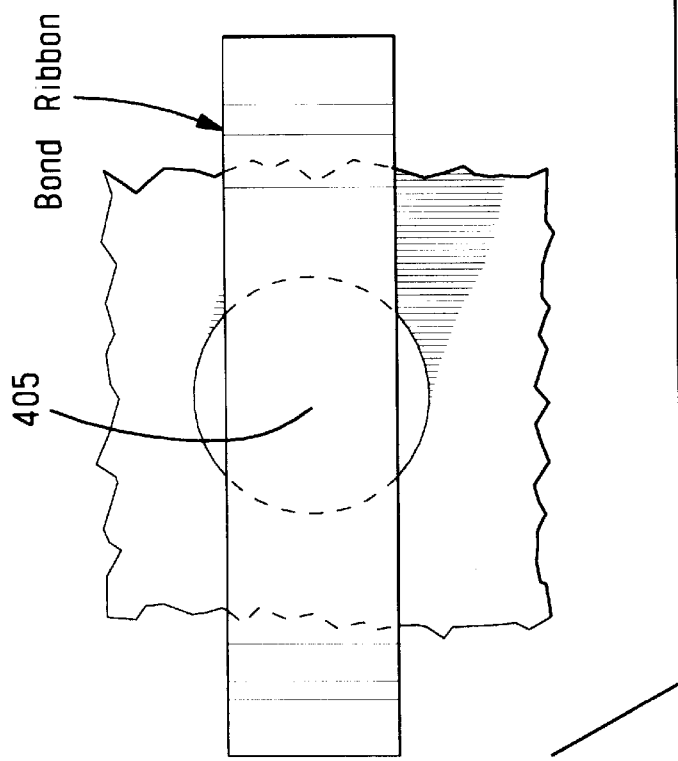

Turning to FIG. 4, a similar device is shown using a varactor using n+doped GaAs substrate 400 with a first layer of n-doped material 401, preferably gallium arsenide. Thereafter a layer of p-doped material 402 is grown epitaxially in a reactor through standard technique.

The layer of semiconductor material 402 has disposed thereon a metallization of PtTiPt through standard deposition and sintering techniques. A mesa is etched in the GaAs by wet chemical etching techniques. A layer of $Si_3N_4$ 403 is deposited by standard techniques acts as a passivation for the mesa. The window shown at 404 is etched through the $Si_3N_4$ passivation layer and the BCB 406 is deposited as described above in a thickness of preferably 4 microns, however a range of thicknesses on the order of 3 microns to 10 microns is anticipated.

The via 407 is etched and the bond pad metallization of 405 and the via metallization 408 of TiPtAgPtAu is deposited through standard techniques. The wafer is thereafter mounted in an upside down fashion and a layer of AuGe-NiAu 409 is deposited in a thickness of 3 to 4 microns to form the n+ohmic contact. Thereafter, the chips in the wafer are saw cut to effect the individual devices. Turning to the top view as is shown in FIG. 3, the bond pad of the present invention incorporates a diameter on the order of four mils depending on the size of the bond ribbon. As stated above, having the diameter of the bond pad 307 greater than the width of the bond ribbon ensures a good adhesion between the bond pad and the bond ribbon.

Figure 2:
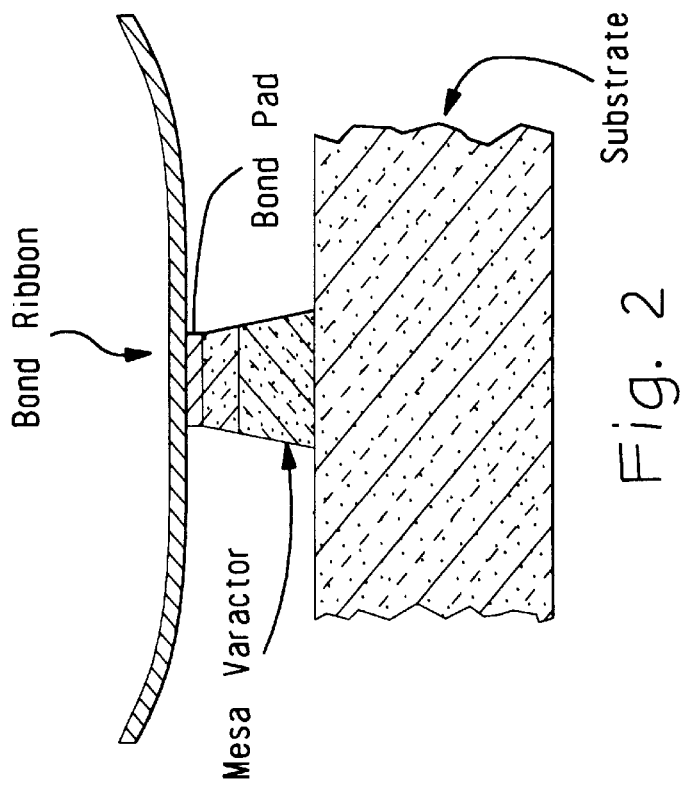
FIGS. 1 and 2 show top view and cross-sectional side view of the prior art technique of the varactor having a bond pad and bind ribbon mounted thereon.
Figure 1:
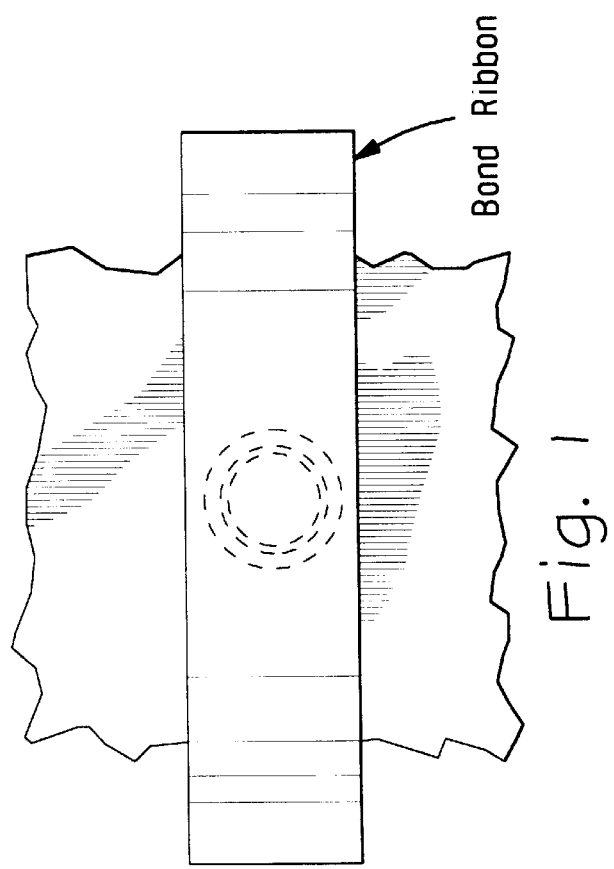

Accordingly, when reliability testing is done through a bond pull test, the strength of the adhesion between the bond pad and the bond ribbon is found to be sufficient to increase yield over the conventional design as is shown in FIGS. 1 and 2 by approximately 80% to 90%.

The attendant advantages of the present invention as described above are a high frequency capability for schottky devices to include schottky diodes and varactors for a variety of applications at microwave and rf frequencies without the adverse effects of parasitic capacitances of the prior art. Furthermore, the present invention enables the reduction of parasitic capacitances associated with bond pads without the adverse effects of the conventional designs on manufacture yields. To this end the strength of the adhesion of the bond pad to the bond ribbon or bond wire depending on application is great enough to withstand bond pull tests and thereby the reliability of the bond is assured. It is the BCB material which has the low dielectric constant as well as the ability to be deposited in a relatively thick layer which enables a relatively large bond pad to be deposited at its top surface and yet not significantly increase the parasitic capacitance associated with the bond pad.

The invention having been described in detail, it is clear that modifications to the overall structure as well as material and steps for processing are readily apparent to one of ordinary skill in the art. To the extent that such modifications and variations of the teaching of the present invention effect a lower capacitance high frequency semiconductor device having increased manufactured yields by virtue of a larger bond pad surface by the use of a dielectric material about the device is considered within the purview of the invention.

We claim:

1. A reduced parasitic capacitance schottky barrier device, comprising:

a substrate on which is disposed a layer of selectively doped semiconductor material; a layer of barrier metal disposed on said layer of semiconductor material; a layer of BCB disposed above said substrate and about said semiconductor layer and said barrier metal layer; a via having electrically conductive material disposed therein, said via disposed between a top surface of said BCB and said barrier metal layer; and a bond pad disposed on said top surface of BCB about said via and in electrical contact with said barrier metal by way of said electrically conductive material disposed in said via.

2. A schottky barrier device as recited in claim 1 further comprising:

a layer of dielectric material disposed between said semiconductor material and surrounding said barrier metal layer.

3. A schottky barrier device as recited in claim 1 wherein said device is a schottky barrier diode in said barrier metal is titanium.

4. A schottky barrier device as recited in claim 1 wherein said device is a schottky diode and said barrier metal is TiW.

5. A schottky barrier device as recited in claim 1 wherein said device is a schottky barrier diode in said barrier metal layer is Pt.

6. A reduced parasitic capacitance schottky barrier device comprising:

a substrate on which is disposed a mesa of a first layer of semiconductor material of a first doping type and a second layer of semiconductor material of a second doping type; a layer of BCB substantially surrounding said mesa; a via disposed in said BCB, said via having an electrically conductive material disposed therein; and a bond pad disposed on a top surface of said BCB and in electrical contact with said mesa by way of said electrically conductive material disposed in said via.

7. A schottky barrier device as recited in claim 6 wherein said device is a varactor diode.

8. A schottky barrier device as recited in claim 6 wherein a passivation layer is disposed about said mesa and on top of said substrate, said passivation layer having a window disposed therein.

* * * * *